United States Patent [19]

Negi

[11] Patent Number: 5,600,695
[45] Date of Patent: Feb. 4, 1997

[54] COUNTER CIRCUIT HAVING LOAD FUNCTION

[75] Inventor: Keiji Negi, Tokyo, Japan

[73] Assignee: Ando Electric Co., Ltd., Tokyo, Japan

[21] Appl. No.: 530,444

[22] Filed: Sep. 19, 1995

[30] Foreign Application Priority Data

Sep. 30, 1994 [JP] Japan ................................ 6-261738

[51] Int. Cl.$^6$ ..................................... H03K 21/40
[52] U.S. Cl. ............................. 377/51; 377/116; 377/119
[58] Field of Search ............................ 377/51, 111, 116, 377/119

[56] References Cited

U.S. PATENT DOCUMENTS 5,361,289  11/1994  Kawano .................................. 377/51

FOREIGN PATENT DOCUMENTS

| 2-185131 | 7/1990 | Japan . | |
|---|---|---|---|
| 0525249 | 8/1976 | U.S.S.R. | 377/51 |
| 0681431 | 8/1979 | U.S.S.R. | 377/51 |

Primary Examiner—Margaret Rose Wambach
Attorney, Agent, or Firm—Finnegan, Henderson, Farabow, Garrett & Dunner, L.L.P.

[57] ABSTRACT

A counter circuit having a load function which is able to speedily yet stably perform counting operations no matter what kind of value has been loaded. The counter circuit having a load function performs counting operations in synchronization with an input clock signal and is able to count from an arbitrary value upon receiving a count initiation value in synchronization with a load signal. The principal composing elements are: at least three counter circuits 1-1~1-N, each of which corresponds to a numerical digit; at least one load value monitor circuit 2-i (wherein i is an integer between 3 and N), which detects whether or not load values of the counter circuits 1 corresponding to lower digits are full count values upon input of the count initiation value in synchronization with the load signal, and delays the output of the load signal by one clock period if a full-count value has been detected; and at least one OR circuit 3-i, which receives an output from load value monitor circuit 2-i and a carry output from counter circuit 1-(i-1), then outputs their logical sum to an ET terminal of counter circuit 1-i.

2 Claims, 5 Drawing Sheets

| INPUT | | | | OUTPUT | |
|---|---|---|---|---|---|
| CK | $\overline{\text{LOAD}}$ | EP | ET | Q | CO |
| ↑ | LOW | X | X | LOAD | X |
| ↑ | HIGH | HIGH | HIGH | COUNT | X |
| X | HIGH | LOW | X | NO COUNT | X |
| X | HIGH | X | LOW | NO COUNT | LOW |

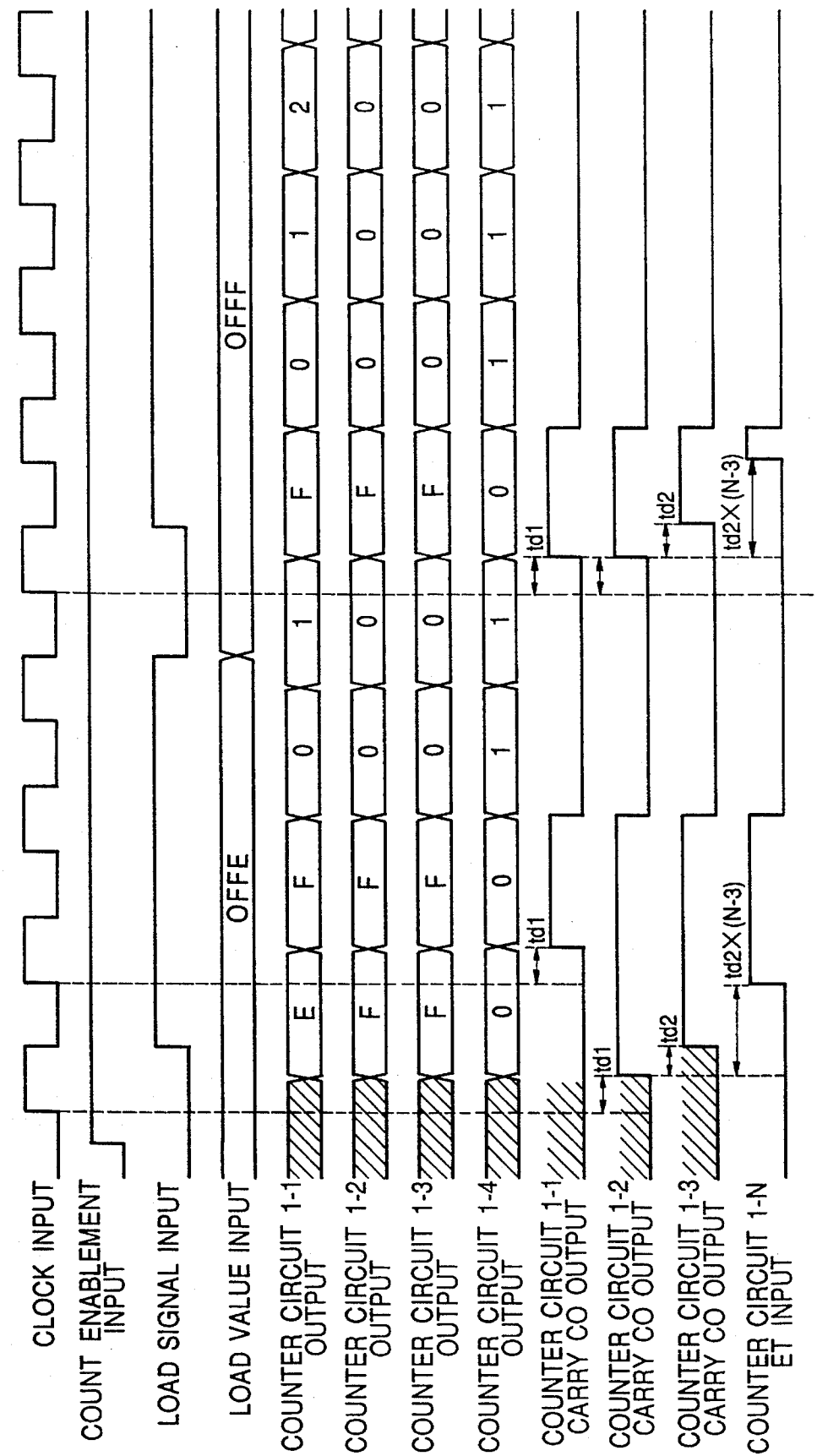

COUNTER CIRCUIT HAVING LOAD FUNCTION

BACKGROUND OF THE INVENTION

1. Field of the Invention

The present invention relates to synchronized counter circuits which operate in synchronization with clocks, and more specifically to counter circuits having load functions with which count initiation values are able to be set.

2. Background Art

Methods for arranging counter circuits wherein two or more counter circuits are "multi-digit connected" are known to be useful when the number of digits in the values being counted are large. "Multi-digit connection" refers to a connection method wherein counter circuits are connected in multiple stages in such a way that a carry output from a lower-digit counter circuit is connected to a count enablement input terminal of a higher-digit counter circuit.

Additionally, in order to allow counting of the count values to commence at an arbitrary value, a conventional method is to introduce a count initiation value into the counter circuit by means of a load signal and to begin the counting operation upon release of the load signal.

Such a conventional counter circuit having a load function for counting values from an arbitrary value is illustrated in FIG. 5 in the form of a block diagram. In FIG. 5, reference numerals 1-1~1-N indicate counter circuits, reference numeral 4 indicates a load signal input terminal, reference numeral 5 indicates a load value input terminal, reference numeral 6 indicates a count enablement input terminal and reference numeral 7 indicates a count value output terminal.

Next, the operation of the counter circuits 1-1~1-N of FIG. 5 will be explained with reference to FIG. 3. Each of the counter circuits 1-1~1-N operates in synchronization with a clock input, and when the load signal input terminal 4 is at LOW level, the inputted value is set at the load value input terminal 5 with the rising of the clock pulse. Additionally, when the load signal input terminal 4 is at HIGH level and the EP terminal and ET terminal are also at HIGH level, each of the counter circuits 1 goes into a counting state and commences a counting operation upon reception of the input clock pulse at the clock input CK.

The carry output CO of each counter circuit 1 releases a HIGH level output when the count value is in a state such that the next clock input would result in a promotion to the next digit, that is, when a full count value is being output. When either the EP terminal or the ET terminal is at LOW level, the counter circuit goes into a count prevention state, and maintains such a state without performing any counting operations even if a clock signal is input. In particular, when the ET terminal is at LOW level, the carry output always outputs a LOW level signal.

As shown in FIG. 5, the counter circuit 1-1 counts the lowest digit in the count value output from the count value output terminal 7. Then, the carry output of the counter circuit 1-1 is connected to the EP terminals of the higher digit counter circuits 1-2~1-N. Additionally, the count enablement input terminal 6 is connected to the EP terminal and ET terminal of the first counter circuit 1-1, and the ET terminal of counter circuit 1-2 is always held at HIGH level. Furthermore, to the ET terminals of the counter circuits 1-3~1-N corresponding to the each of the higher digits, the carry output of the next highest digit is input.

During normal operation of the counter, a counting operation is performed when the counter circuit 1-1 goes into a full count state and releases a carry signal while a carry signal is output from the counter circuit of the next highest digit for each counter circuit 1-2~1-N.

An operational example of this circuit will be explained with reference to the time chart given in FIG. 6. The time chart of FIG. 6 shows an example wherein the counter 1-1~1-N of each digit counts up the digits "0"~"F", in hexadecimal notation, with a 4-bit upcounter.

First, the counter circuit with load function is put into a count-ready state when the count enablement signal input terminal 6 is put at HIGH level. The load value "0FFE" is set at the load value input terminal 5, and when the load signal input terminal 4 is at LOW level, a load value is loaded into each counter circuit 1-1~1-N with the reception of a clock pulse. At this time, a promotion to the next digit occurs in the counter circuit 1-2 with the next count, and a carry output CO is output because the ET terminal is at HIGH level.

Although a promotion also occurs in counter circuit 1-3 with the next count, a carry output CO is not output until a HIGH level signal is input to the ET terminal of this counter circuit. That is, defining td1 to be the duration of time from clock pulse to the carry output CO and td2 to be the duration of time from the signal input at the ET terminal to the carry output CO, then the amount of time elapsed between the input of the clock signal to the carry output for the counter circuit 1-3 would be td1+td2.

Therefore, if a counter circuit having load function is composed of N counter circuits, when a value such that the next count would result in a promotion is read into counter circuits 1-2-1-(N-1), the time elapsed from the clock pulse until the input of the carry output CO of counter circuit 1-(N-1) to the ET terminal of the counter circuit 1-N would be td1+td2*(N-3).

After the input at the ET terminal of each counter circuit 1-1~1-N has been defined, the counter circuit having load function counts up 1 each time the load signal input terminal 4 becomes HIGH and a clock pulse is input. For this reason, in the case in which the load value is "0FFF", if this load value is loaded into the counter circuits 1-1~1-N corresponding to each digit, there is the possibility that a promotion to the next digit will occur in counter circuit 1-4 with the clock signal released right after a carry output CO has been output from the lowest digit counter circuit 1-1. In order for the counter circuits 1-1~1-N corresponding to each digit to operate correctly after the load values have been loaded, the input to the ET terminal for each counter circuit 1-1~1-N must be defined before the next clock input.

If the period of the input clock is very long in comparison to the signal definition time of the ET terminal of each of the counter circuits 1-1~1-N, or if the counter circuit 1-1 does not contain a load value such that the next count would result in a promotion to the next digit, in other words, if there is no full count value, the delay time of the ET terminal input does not present a problem. However, when the input clock period is short and a full count has been set at the load value input terminal 5 of the counter circuits 1-1~1-N, then the counter circuit 1-N cannot perform a proper count because, due to the delay time, the next clock pulse is input before the ET terminal input of counter circuit 1-N is defined.

Consequently, there have been problems whereby conventional counter circuits having load functions could not output the correct counter values, resulting in faulty operations. As the number of counter circuits 1-1~1-N composing the counter circuit having load function increases, the delay time td2 elapsed between the signal input to the ET terminal of the counter circuit until the release of the carry output CO accumulates. When designing a conventional counter circuit under consideration of this delay time so that faulty operations do not occur, there is a problem in that the input clock period must be chosen to be able to handle the time elapsed until the signal definition at the ET terminal of the N-th counter circuit, slowing the operation speed of the entire circuit.

SUMMARY OF THE INVENTION

The object of the present invention is to offer a counter circuit having a load function which is able to speedily yet stably perform counting operations regardless of the value set as the load value.

In order to fulfill the above-mentioned objective, the present invention performs counting operations in synchronization with an input clock signal and is able to count from an arbitrary value upon receiving a count initiation value in synchronization with a load signal. The principal composing elements are: at least three counter circuits 1-1~1-N, each of which corresponds to a numerical digit; at least one load value monitor circuit 2-i (wherein i is an integer between 3 and N), which detects whether or not load values of the counter circuits 1 corresponding to lower digits are full count values upon input of the count initiation value in synchronization with the load signal, and delays the output of the load signal by one clock period if a full count value has been detected; and at least one OR circuit 3-i, which receives an output from load value monitor circuit 2-i and a carry output from counter circuit 1-(i-1), then outputs their logical sum to an ET terminal of counter circuit 1-i.

With the present invention, a load value monitor circuit 2-3 monitors the load values of the first and second counter circuits 1-1 and 1-2 corresponding to the two lowest digits to determine if a promotion to the next digit will occur upon the clock input directly after the load value has been loaded. In other words, the load value monitor circuit 2-3 detects if the load value set in the first and second counter circuits 1-1 and 1-2 are full count values. If the load value of the lowest counter circuit 1 is at full count, the load value monitor circuit 2-3 outputs a load signal delayed by one clock period. An OR circuit 3-3 calculates the logical sum of this load signal and a carry output signal from the second counter circuit 1-2, and inputs the result into the ET terminal of the counter circuit corresponding to the next digit. As a result, when a full count value has been set at the first and second counter circuits 1-1 and 1-2 and the carry output of the second counter circuit 1-2 is delayed, an ET signal input is output from the load value monitor circuit 2-3 and input to the ET terminal of counter circuit 1-3, allowing the counter circuit 1-3 to commence a counting operation.

According to such a function of the present invention, the load value monitor circuit which monitors the load values set in the lower digit counter circuits outputs an ET terminal input signal to the higher counter circuits, so that even if a full count value has been set as the load value in a lower counter circuit and the carry output of the lower counter circuit is delayed, the operation is able to be performed as if a normal value had been set. That is, a speedy and stable operation is able to be performed no matter what value has been set as the load value.

BRIEF DESCRIPTION OF THE DRAWINGS

FIG. 6 is a time chart illustrating an operational example of the conventional example shown in FIG. 5.

DESCRIPTION OF THE PREFERRED EMBODIMENTS

Figure 1:
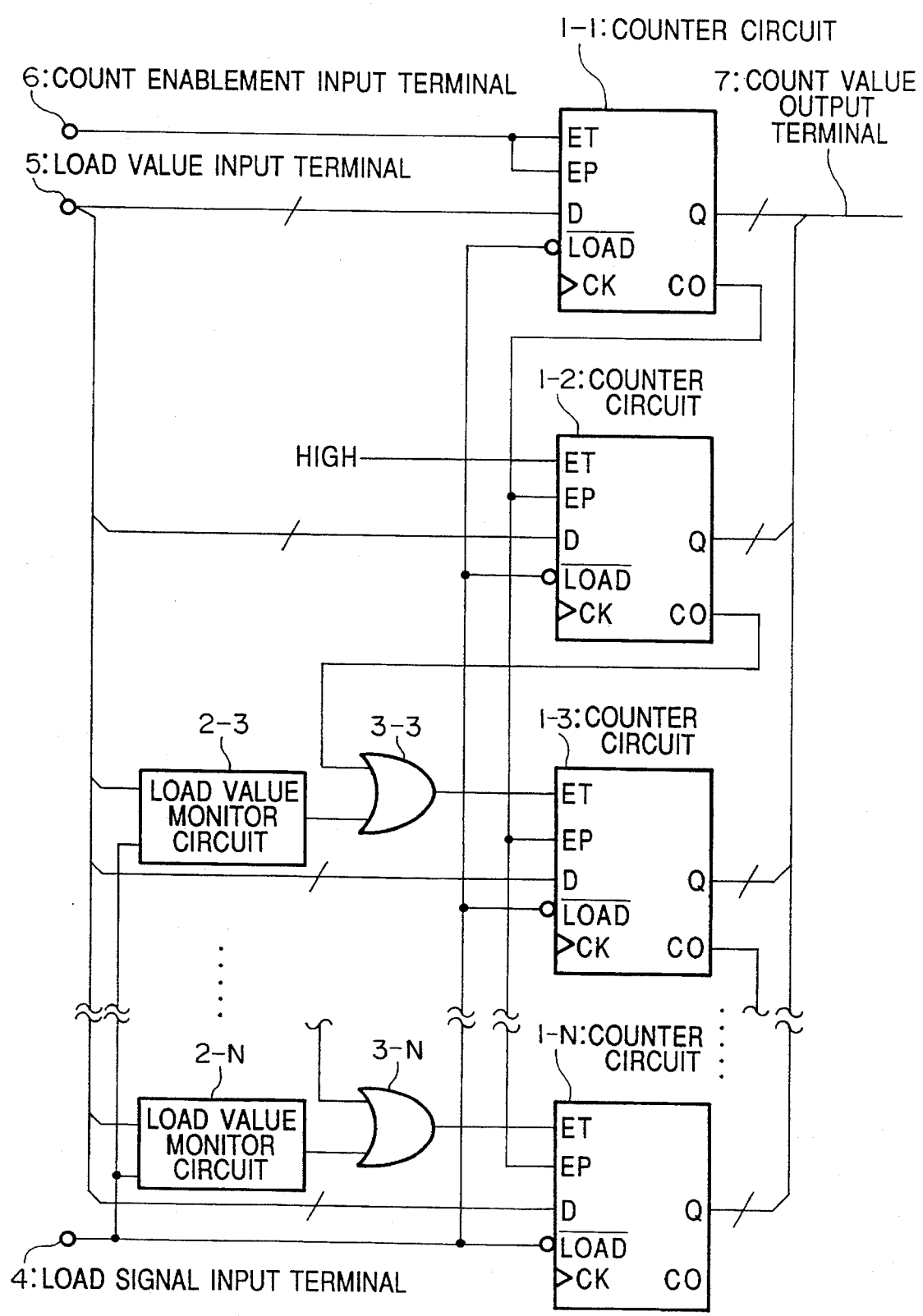
FIG. 1 is a block diagram illustrating an embodiment of a counter circuit having a load function according to the present invention.

Next, an embodiment of the counter circuit having load function according to the present invention will be explained with reference to the block diagram shown in FIG. 1. In FIG. 1, reference numerals 1-1~1-N indicate counter circuits corresponding to each digit, reference numerals 2-3~2-N indicate load value monitor circuits, reference numerals 3-3~3-N indicate OR circuits, reference numeral 4 indicates a load signal input terminal, reference numeral 5 indicates a load value input terminal, reference numeral 6 indicates a count enablement input terminal and reference numeral 7 indicates a count value output terminal.

Figure 5:
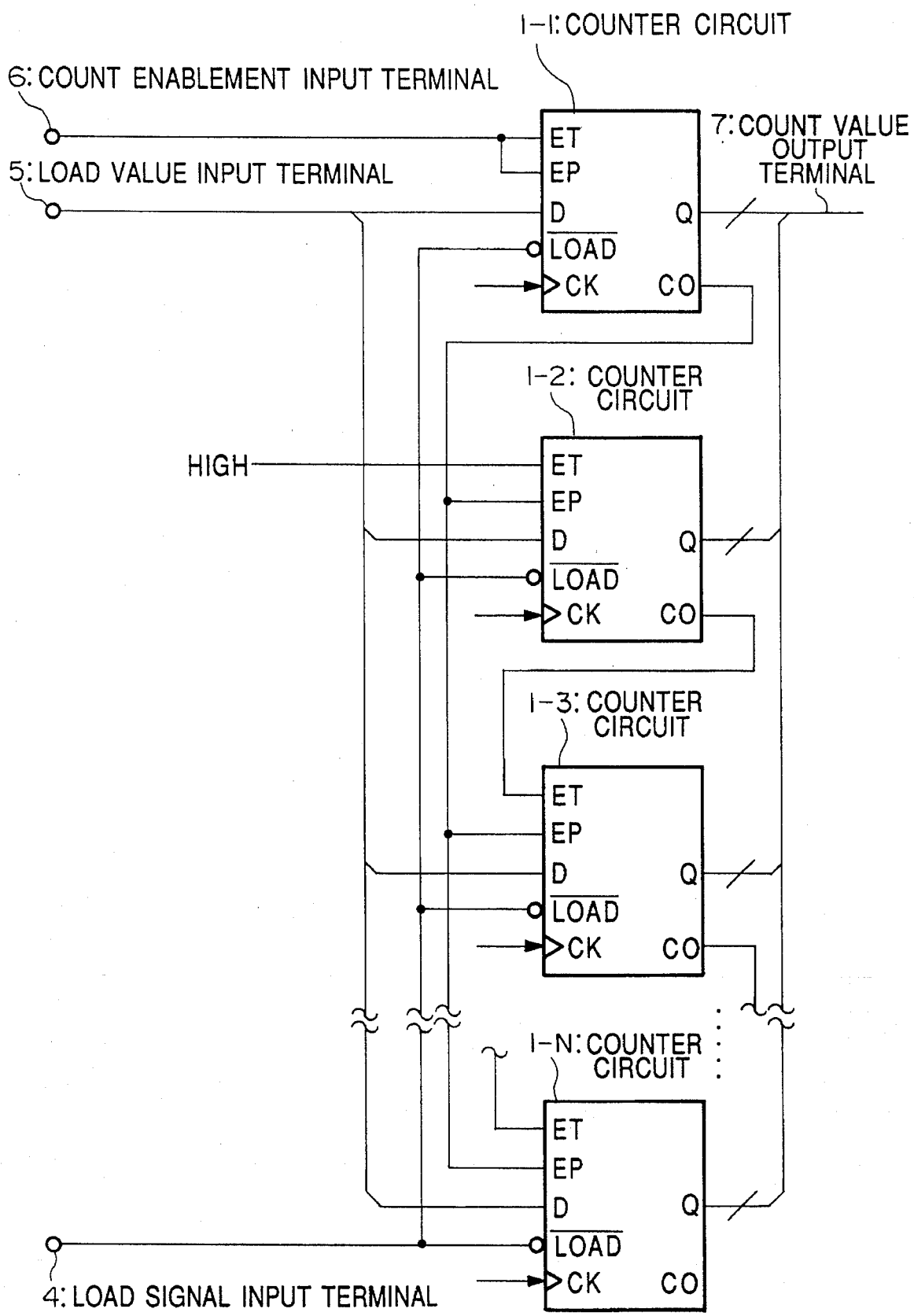
FIG. 5 is a block diagram illustrating an example of a conventional counter circuit having a load function.

The counter circuits 1-1~1-N in FIG. 1 are identical to the counter circuits explained in FIG. 5, and general-purpose logic ICs such as 74LS160's or 74LS161's can be used therefor. The load signal input terminal 4 and the load value input terminal 5 are connected to the load value terminals of each of the counter circuits 1-1~1-N as well as each load value monitor circuit 2-3~2-N. Each load value monitor circuit 2 outputs a load signal delayed by a single clock period if the load value of a lower counter circuit is such that a promotion to the next digit will occur on the next count. The count enablement input terminal 6 is connected to the ET terminal and EP terminal of the counter circuit 1-1. Additionally, the ET terminal of counter circuit 1-2 is always held at HIGH level.

The carry output CO of the counter circuit 1-1 is connected to the EP terminals of every counter circuit 1 corresponding to the higher digits. As a result, a carry output is released from counter circuit 1-1 and a counter circuit 1 which receives a carry output at the ET terminal performs a counting operation with the release of a clock pulse. Additionally, an output terminal of an OR circuit, to which is input the output of a load value monitor circuit 2 and the carry output CO of the counter circuit corresponding to the next highest digit, is connected to each of the ET terminals of the counter circuits 1-3~1-N corresponding to digits higher than the third counter circuit 1-3.

Figures 2, 3:
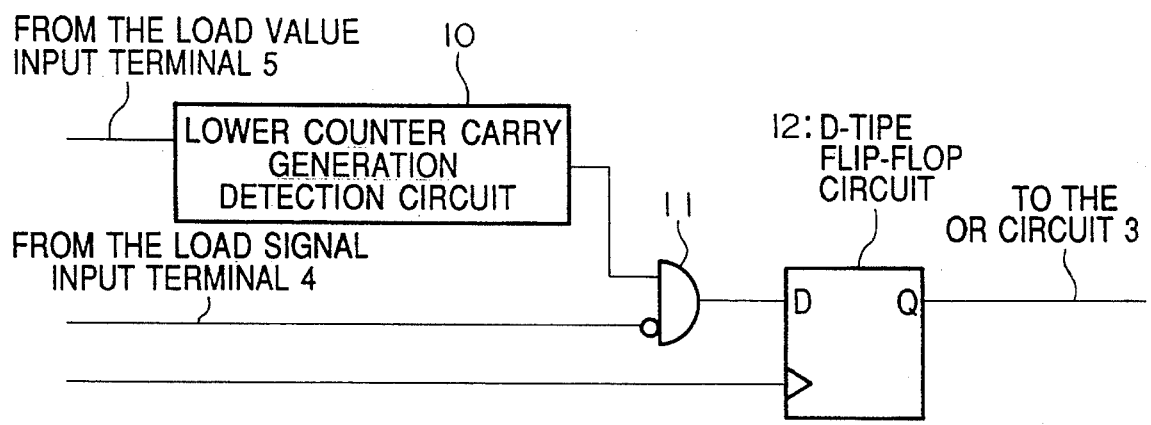
FIG. 2 is a block diagram illustrating one possible arrangement of the load value monitor circuit of FIG. 1.
FIG. 3 is a table for explaining the operations of a counter circuit having load function according to the present invention.

Next, the operations of the counter circuit having load function according to the arrangement shown in FIG. 1 will be explained. Each counter circuit 1-1~1-N operates according to the table shown in FIG. 3. In FIG. 3, the symbol "x" indicates either that neither HIGH nor LOW level is reached, or that HIGH and LOW levels are determined by other factors. The i-th load value monitor circuit 2-i (wherein i is an integer between 3 and N) monitors the load value set in the first through (i-1)-th counter circuits 1-1~1-(i-1). If the value is a full count value, then the i-th load value monitor circuit 2-i outputs a load signal delayed by one clock period, and otherwise always outputs a LOW level signal.

Next, an example of an arrangement for the load value monitor circuit 2 will be explained with reference to FIG. 2.

In FIG. 2, reference numeral 10 indicates a lower counter carry generation detection circuit, reference numeral 11 indicates a gate element which is an AND gate and reference numeral 12 indicates a D-type flip-flop circuit. The lower counter carry generation detection circuit 10 monitors the load value input from the load value input terminal 5 and determines whether or not a full count value is set in all of the lower counter circuits 1. If a full count value has been set, then a gate signal is output to gate element 11 to open the gate element 11, and the load signal inputted from the load signal input terminal 4 is inverted and outputted. Upon the input of a clock signal into the input terminal CK, the D-type flip-flop circuit 12 outputs the load signal held up at the gate element 11 after a delay of a single clock period.

Each of the OR circuits 3-3~3-N calculates the logical sum of the output of the load value monitor circuit 10 and the carry output of the counter circuit 1 corresponding to the next highest digit, then outputs the logical sum to the ET terminal of the counter circuit 1-3~1-N. Therefore, in a normal counting situation wherein not all of the values in the lower digit counter circuits 1 are full count values, each of the higher digit counter circuits 1 counts by means of the carry output CO of the next highest counter circuit. When all of the values in the lower counter circuits are full count values, the higher digit counter circuits 1-3~1-N perform counting operations on the ET signals output from the load value monitor circuits 2 upon the first clock input after the release of the load signal input terminal 4.

Figure 4:
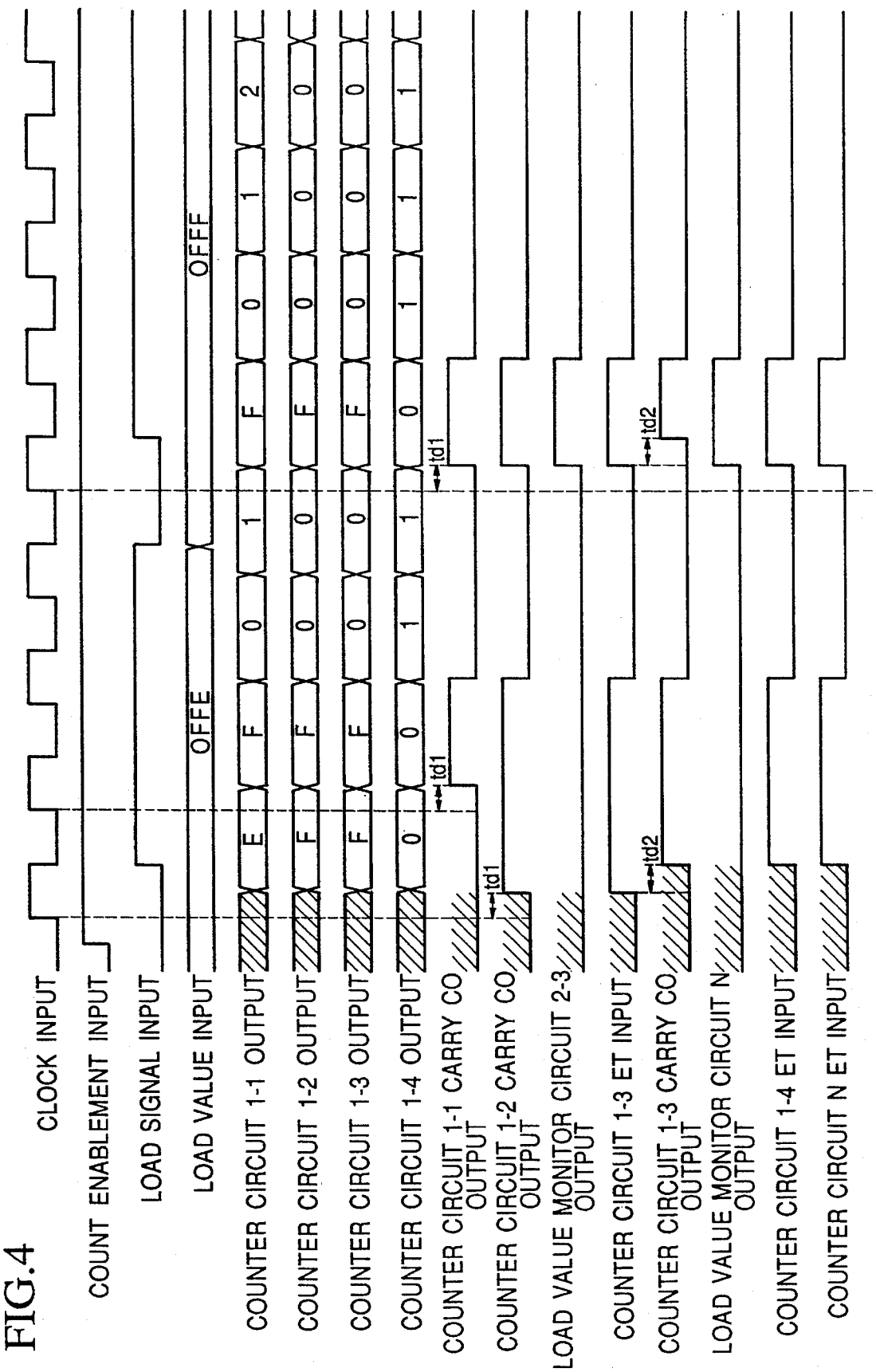
FIG. 4 is a time chart illustrating an operational example of the embodiment shown in FIG. 1.

Next, the operation of a counter circuit having a load function according to the present embodiment will be explained with reference to FIG. 4. When a value "0FFE", which is not a full count value, is set at the load value input terminal 5 for the counter circuits corresponding to the lower digits, the load value monitor circuit 2-3 is always at LOW level. If a load value is loaded while the load signal is at LOW level, those ET terminals of counter circuits loaded with full count values output carry signals when a HIGH is input. The carry signal of counter circuit 1-3 is output after a duration of td2 has elapsed from the carry signal is output from counter circuit 1-2.

After the load signal goes to HIGH level, the lowest counter circuit 1-1 commences counting up upon receiving a clock input pulse. Then, when the lowest counter circuit 1-1 outputs a carry signal, the counter circuits corresponding to the higher digits begin counting up upon receiving the carry signal output from the counter circuit corresponding to the next highest digit. The input signals to the ET terminals of the higher counter circuits are defined before the lowest counter circuit 1-1 outputs a carry signal, so the counter circuit is able to operate without error.

Next, when a full count value "0FFF" is set at the load value input terminal 5 of the lower counter circuits, the load signal goes to LOW level and the load value is loaded into counter circuit 1. Then, the counter circuit 1-1 outputs a carry output CO because a full count value has been loaded into the lowest counter circuit 1-1, and a promotion to the next digit occurs on the next clock pulse. Additionally, the load value monitor circuit 2-3 detects that a full count value has been set at the lower counter circuits 1-1~1-2 and therefore outputs a load signal after a delay of one clock period.

As a result, a HIGH level signal is input to the ET terminal of counter circuit 1-3. The states of the ET terminals of the counter circuits 1-1~1-N are therefore defined after delay times from the clock pulse which are set by the load value monitor circuits. Consequently, delays do not accumulate as is common in the conventional art, and accurate promotion operations can be performed even after load values such as "0FFF", by which carry signals are generated in the lower counter circuits, have been loaded.

What is claimed is:

1. A counter circuit having a load function which performs counting operations in synchronization with an input clock signal and is able to count from an arbitrary value upon receiving a count initiation value in synchronization with a load signal, comprising:

at least three counter circuits, each of which corresponds to a numerical digit;

at least one load value monitor circuit, each of which detects whether or not load values of the counter circuits corresponding to lower digits are full count values upon input of said count initiation value in synchronization with a load signal, and delays the output of said load signal by one clock period if a full count value has been detected; and at least one OR circuit, each of which receives an output from one of said load value monitor circuits and a carry output from one of said counter circuits, then outputs their logical sum to an ET terminal of another of said counter circuits.

2. A counter circuit having a load function as claimed in claim 1, wherein each of said load value monitor circuits comprises:

a lower digit counter carry generation detection circuit which receives a load value and detects whether or not said load value is such that carry output signals would be output from all of the counter circuits corresponding to lower digits;

a gate element which receives a detection output signal from said lower digit counter carry generation detection circuit at one input terminal and a load signal at another input terminal, then outputs a high-level load signal if said load signal is input while said detection output signal is being output; and a flip-flop which receives the load signal output from said gate element at one input terminal and an input clock signal at another input terminal, then outputs said load signal after a delay of one clock period.

* * * * *